US010545545B2

(12) United States Patent
Helberg et al.

(10) Patent No.: US 10,545,545 B2
(45) Date of Patent: Jan. 28, 2020

(54) TRIANGULAR SYSTEM FOR MODIFIABLE THERMAL CONTROL

(71) Applicant: Dell Products, LP, Round Rock, TX (US)

(72) Inventors: Christopher M. Helberg, Austin, TX (US); Shawn P. Hoss, Round Rock, TX (US); Edward D. Knapton, Pflugerville, TX (US)

(73) Assignee: Dell Products, LP, Round Rock, TX (US)

( * ) Notice: Subject to any disclaimer, the term of this patent is extended or adjusted under 35 U.S.C. 154(b) by 204 days.

(21) Appl. No.: 14/448,389

(22) Filed: Jul. 31, 2014

(65) Prior Publication Data

US 2016/0034007 A1    Feb. 4, 2016

(51) Int. Cl.
*G06F 1/20* (2006.01)
*H05K 7/20* (2006.01)

(52) U.S. Cl.
CPC .............. *G06F 1/206* (2013.01); *H05K 7/20* (2013.01); *H05K 7/20009* (2013.01); *H05K 7/20136* (2013.01); *H05K 7/20145* (2013.01); *H05K 7/20209* (2013.01)

(58) Field of Classification Search
CPC ...... G06F 1/206; H05K 7/20; H05K 7/20009; H05K 7/20136; H05K 7/20145; H05K 7/20209
See application file for complete search history.

(56) References Cited

U.S. PATENT DOCUMENTS

| 5,345,807 A | 9/1994 | Butts et al. |
| 5,361,188 A * | 11/1994 | Kondou ............... H01L 23/467 165/104.34 |
| 5,434,566 A | 7/1995 | Iwasa et al. |
| 5,515,040 A | 5/1996 | Lee et al. |

(Continued)

FOREIGN PATENT DOCUMENTS

WO    WO 2012/112275 A1    8/2012

OTHER PUBLICATIONS

"Wieson's P-Sensor Efficiently Reduce the SAR from Handheld Device," Wireless Application Business Unit, May 14, 2012, 2 pgs., http://www.wieson.com/go/en/wieson/news_show.php?nid=12392 &catalog=Product%20News.

(Continued)

*Primary Examiner* — Mukundbhai G Patel
*Assistant Examiner* — Zhengfu J Feng
(74) *Attorney, Agent, or Firm* — Prol Intellectual Property Law, PLLC; H. Kenneth Prol

(57) ABSTRACT

An information handling system includes a triangular chassis, a plurality of graphics cards, and a plurality of air movers. An air stream of a first air mover may be axially aligned with the graphics cards and the first air mover may to direct the air stream into a first zone of the information handling systems including the graphics cards, the air stream being parallel to a longitudinal axis of the graphics cards. The first air mover may be a fan and the air flow may be laminar. A second zone of the information handling systems may include a CPU. The first zone may include a power supply unit. The air movers may be controlled independently, enabling independent control of a temperature in the first zone and a temperature in the second zone.

20 Claims, 7 Drawing Sheets

(56) References Cited

U.S. PATENT DOCUMENTS

| | | | |
|---|---|---|---|
| 5,574,858 A | 11/1996 | Witte | |
| 5,790,102 A | 8/1998 | Nassimi | |
| 5,892,654 A | 4/1999 | Worden, Jr. | |
| 6,098,184 A | 8/2000 | Patterson, Jr. | |
| 6,107,997 A | 8/2000 | Ure | |
| 6,135,886 A | 10/2000 | Armstrong | |
| 6,166,723 A | 12/2000 | Schena et al. | |
| 6,587,093 B1 | 6/2003 | Shaw et al. | |
| 7,024,625 B2 | 4/2006 | Shali | |
| 7,136,045 B2 | 11/2006 | Rosenberg et al. | |
| 7,154,748 B2 * | 12/2006 | Yamada | H05K 7/20572 361/690 |
| 7,710,397 B2 | 5/2010 | Krah et al. | |
| 7,817,135 B2 | 10/2010 | Shaw et al. | |
| 8,035,616 B2 | 10/2011 | Shaw et al. | |
| 8,243,018 B2 | 8/2012 | Farag et al. | |
| 8,577,289 B2 | 11/2013 | Schlub et al. | |
| 2005/0088445 A1 * | 4/2005 | Gonzalez | G06F 3/1438 345/502 |
| 2006/0087805 A1 * | 4/2006 | Massih | G06F 1/181 361/679.02 |
| 2009/0140985 A1 | 6/2009 | Liu | |
| 2010/0127983 A1 | 5/2010 | Irani et al. | |
| 2010/0148999 A1 | 6/2010 | Casparian et al. | |
| 2010/0201626 A1 | 8/2010 | Krah et al. | |
| 2010/0321301 A1 | 12/2010 | Casparian et al. | |
| 2012/0164007 A1 | 6/2012 | Gamble et al. | |
| 2013/0120931 A1 * | 5/2013 | Sankar | H05K 7/20745 361/679.48 |
| 2013/0176680 A1 * | 7/2013 | Lovicott | G06F 1/206 361/679.48 |
| 2013/0343916 A1 | 12/2013 | Curtis et al. | |
| 2014/0277750 A1 * | 9/2014 | Artman | G05B 15/02 700/275 |
| 2014/0362523 A1 * | 12/2014 | Degner | G06F 3/00 361/679.47 |

OTHER PUBLICATIONS

"802.11n Demystified—Key considerations for n-abling the Wireless Enterprise," Motorola White Paper, 802 11nDEM_WP_v4_0209, 12 pgs, Feb. 2009, http://www.motorolasolutions.com/web/Business/_Documents/White%20Paper/_Static%20files/802%2011nDEM_WP_v4_0209.pdf.

* cited by examiner

TRIANGULAR SYSTEM FOR MODIFIABLE THERMAL CONTROL

FIELD OF THE DISCLOSURE

The present disclosure relates generally to divided thermal control of information handling systems, and more particularly to a triangular system for modifiable thermal control.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems, information handling systems can also implement various virtualized architectures. Data and voice communications among information handling systems may be via networks that are wired, wireless, or some combination. Information handling systems often have systems to control the temperatures of constituent components.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
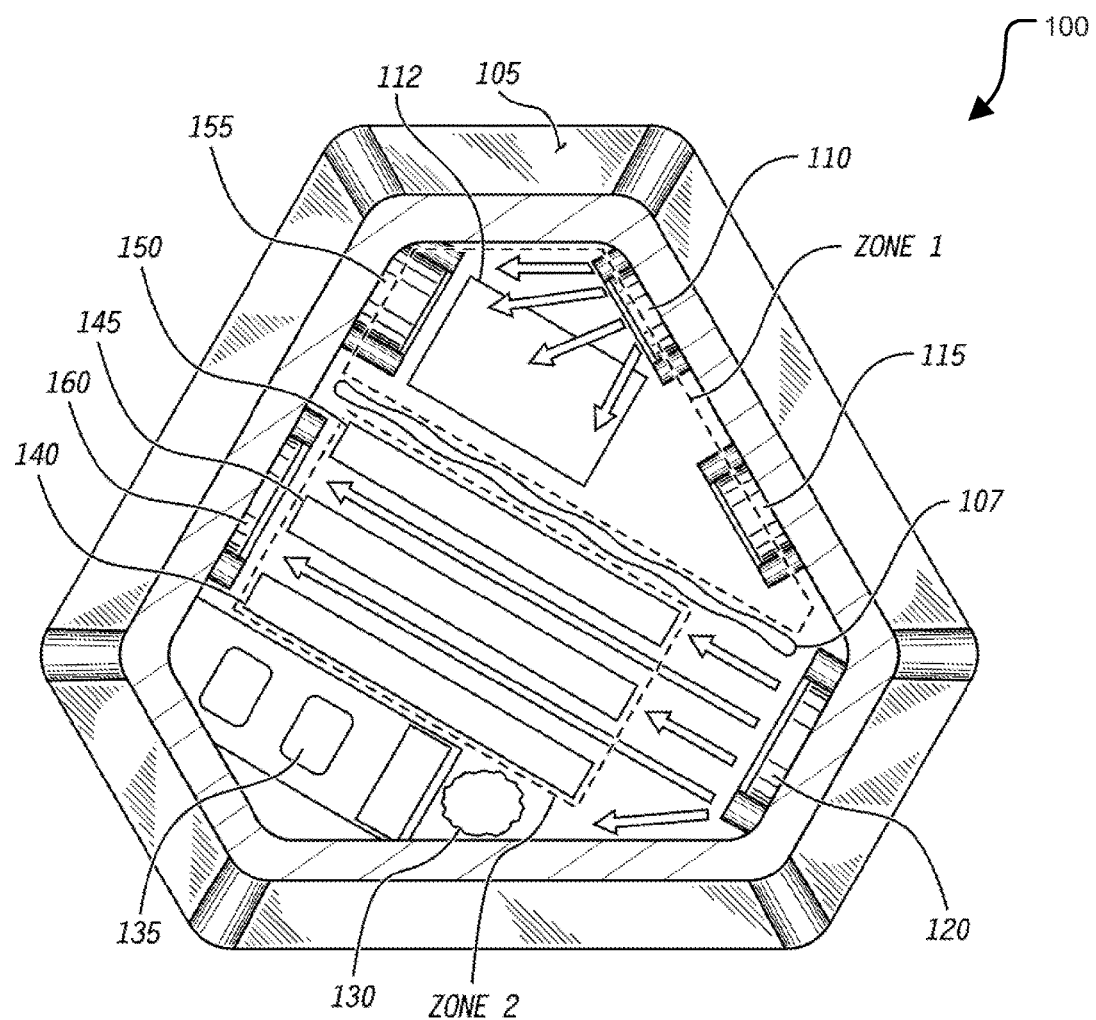
FIG. 1 is a block diagram illustrating a portion of an information handling system according to an embodiment of the present disclosure.

FIG. 1 illustrates a portion of an information handling system 100. For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 100 can include processing resources for executing machine-executable code, such as a central processing unit (CPU), a programmable logic array (PLA), an embedded device such as a System-on-a-Chip (SoC), or other control logic hardware. Information handling system 100 can also include one or more computer-readable medium for storing machine-executable code, such as software or data Additional components of information handling system 100 can include one or more storage devices that can store machine-executable code, one or more communications ports for communicating with external devices, and various input and output (I/O) devices, such as a keyboard, a mouse, and a video display. Information handling system 100 can also include one or more buses operable to transmit information between the various hardware components.

The portion of information handling system 100 includes chassis 105 with components CPU 112, fans 110, 115, 120, and 155, power supply unit (PSU) 135, graphics cards 140, 145, and 150, and optional fan location 160. Chassis 105 is part of the external structure of information handling system 100. As seen in FIG. 1, in a frontal view, chassis 105 is triangular. In the embodiment of FIG. 1, the triangle is equilateral. In other embodiments, a chassis of an information handling system may have the shape of a non-equilateral triangle. The vertices of the triangle are chamfered, or squared off. The area of chassis 105 is divided into two zones, one of which contains CPU 112; and the other of which contains graphics cards 140, 145, and 150 (GPU). Airflow produced by fans 110, 115, 120, and 155 can produce airflow curtain 107, which creates a thermal barrier between the GPU and the CPU. The airflow also creates positive pressure zone 130 over PSU 135. In some embodiments, fan 110 may be 120 mm×38 mm, fan 115 may be 120 mm, and fan 120 may be 120 or 140 mm.

Fans 110, 115, 120, and 155 may provide a portion of a thermal control system for information handling system 100. Information handling systems such as information handling system 100, and in particular high-powered systems such as gaming computers, may require a significant amount of airflow to cool the system. As processors, graphics cards, random access memory (RAM) and other components in information handling systems have increased in clock speed and power consumption, the amount of heat produced by such components as a side-effect of normal operation also increases. Often, the temperatures of these components need to be kept within a reasonable range to prevent overheating, instability, malfunction and damage leading to a shortened component lifespan. Accordingly, air movers such as fans have often been used in information handling systems to cool information handling systems and their components. Air movers may include any mechanical or electro-mechanical system, apparatus, or device operable to move air and/or other gases. In some embodiments, air movers may comprise a fan (e.g., a rotating arrangement of vanes or blades which act on the air). In other embodiments, air movers may comprise a blower (e.g. centrifugal fan that employs rotating impellers to accelerate air received at its intake and change the direction of the airflow). A fan may circulate air around an entire space. A blower may direct airflow at a specific area. The speed of the fan or blower may also be controlled. It may be desirable to provide thermal control for an information handling system with reduced fan blade speed. The reduced speed may require less power and may produce less noise.

In the embodiment of FIG. 1, fans 110 and 115 are placed on opposite ends of one of the sides of chassis 105. Fan 110 is adjacent to CPU 112 near a first vertex formed b the side. Fan 155 is placed on the other side of the chassis connected to the first vertex, also adjacent to CPU 112. Fan 155 may vent airflow from fan 210 or fan 120. Fan 120 is located at the second vertex connected to the side. The axis of fan 120 is directed towards the side of chassis 105 opposite the second vertex. At sufficient velocity, the airflow produced by fans 110, 115, 120, and 155 can produce airflow curtain 107. In some embodiments, airflow curtain 107 is produced by balancing airflow of the four fans (155, 120, 115, and 110). Depending on the system temperatures, the speed of each fan may be adjusted to modify the flow rate of the fan through the fan control algorithm, thus creating an air curtain to manage and optimize the airflow.

The airflow may be a laminar airflow. In a laminar flow, the layers of air of a stream may tend to move together in regular paths such as straight lines. The flow may be relatively smooth. In contrast, turbulent flow may contain eddies or swirls or cross currents perpendicular to the main direction of flow.

An air curtain is a continuous stream of air blown across two portions of a region, forming a flow barrier that impedes the flow of air between the two regions. As a result, the temperature on one side of the region may differ from the temperature on the other side of the curtain. In FIG. 1, air curtain 107 may generate the separate cooling zones within chassis 105. The separate cooling zones may enable the more efficient cooling of the components of information handling system 100. For example, more cooling might be directed to a component in first zone while minimally increasing the cooling of the components in a second zone. To better control the cooling in the separate zones, in some embodiments, the fans 110, 115, 120, and 155 may be controlled independently. The fan speed of one of the fans may, for example, be increased to maintain airflow curtain 107 or to maintain a desired temperature in one of the zones. Alternatively, the fan speed may be decreased if the lower speed will provide an adequate degree of cooling for the zone.

PSU 135 is located near the third vertex of chassis 105. In some embodiments, PSU may contain its own fan. The airflow produced by fans 110, 115, 120, and 155 and the placement of the components and fans may produce high pressure area 130 adjacent to PSU 135. The high pressure area may enable more efficient cooling of PSU 135. Graphics cards 140, 145, and 150 are aligned with an axis of fan 120. An axis of fan 120 is parallel to a longitudinal axis of graphics cards 140, 145, and 150. The alignment may enable amore efficient cooling of the graphics cards, with the airflow produced by fan 120 flowing directly between the graphics cards. The result may be a laminar airflow. In further embodiments, averting fan may vent the airflow produced by fan 120 to aid in producing the laminar airflow. In an embodiment, the spacing between cards may be wider than in standard computer chassis. They may, for example, be approximately 20 mm apart. The spacing between the graphics cards may be similar to those of graphics cards inserted at slots 1, 4, and 7 of a chassis with standard spacing.

In other embodiments, the number and placement of fans in a triangular chassis may differ from the embodiment of FIG. 1. Fan 115 or fan 155 may, for example, be omitted. In addition, a side fan may be placed adjacent to the graphics cards. Further a pulling or venting fan may be located near optional fan location 160. This fan may vent the airflow produced by fan 120, thereby producing a laminar airflow between the graphics cards 140, 145, and 150 and more effectively cooling them. Similarly, a PSU may contain a fan. In other embodiments, a chassis may provide side venting. In other embodiments, the number and location of air curtains and, accordingly, the number and placement of the zones may differ from those of FIG. 1. Moreover, it is understood that the location of information handling system components may be varied vis-à-vis the cooling zones created with the chassis.

In other embodiments, the cooling system of information handling system 100 may include mechanisms other than fans, such as liquid cooling radiators or passive cooling mechanisms. For example, liquid cooling radiators may conduct heat away from a component by the circulation of a liquid through pipes. The radiators may also contain fins to conduct heat from the pipes. The fins may be cooled by airflow from air movers. In further embodiments, a liquid cooling radiator may be positioned to conduct heat from a CPU.

Figure 2A:
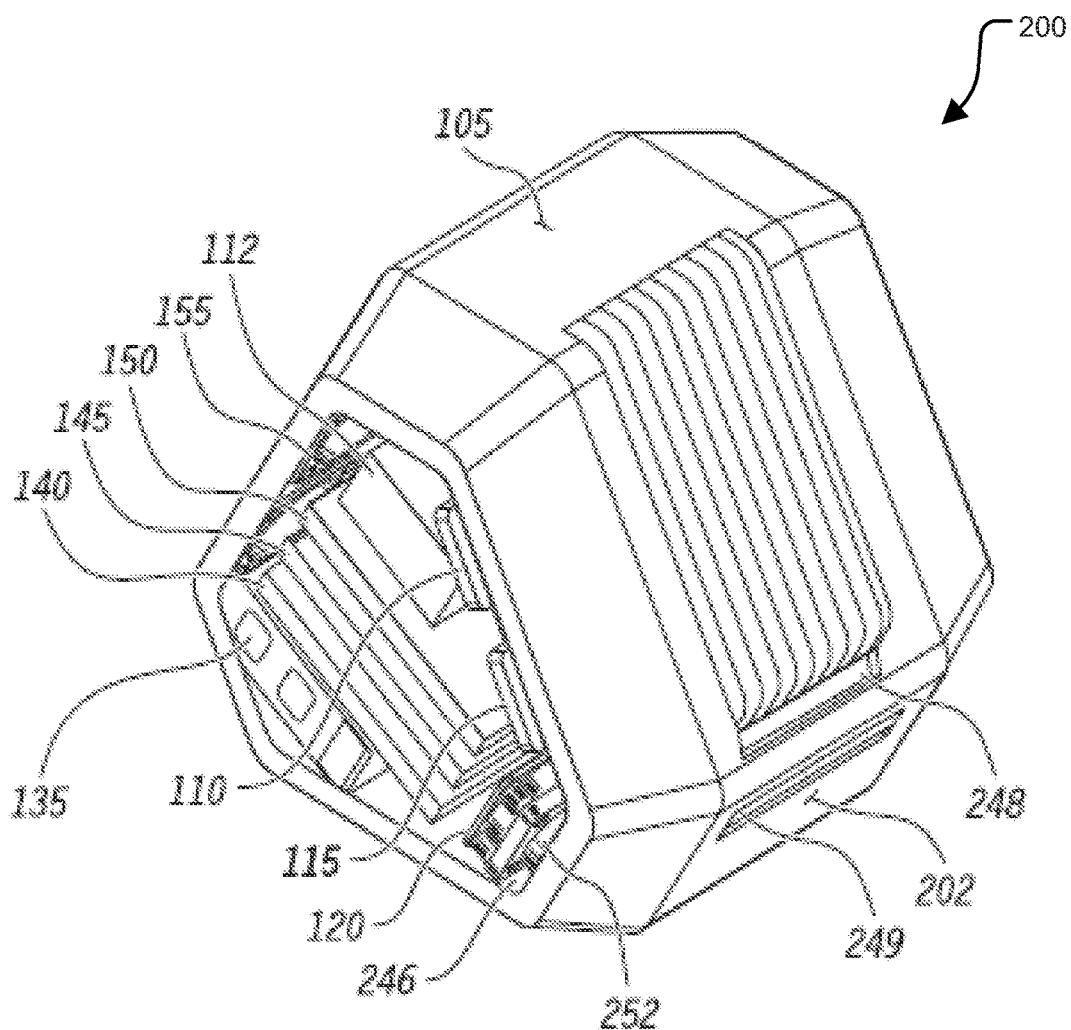
FIGS. 2A and 2B are block diagrams illustrating a portion of an information handling system according to other embodiments of the present disclosure.
Figure 2B:
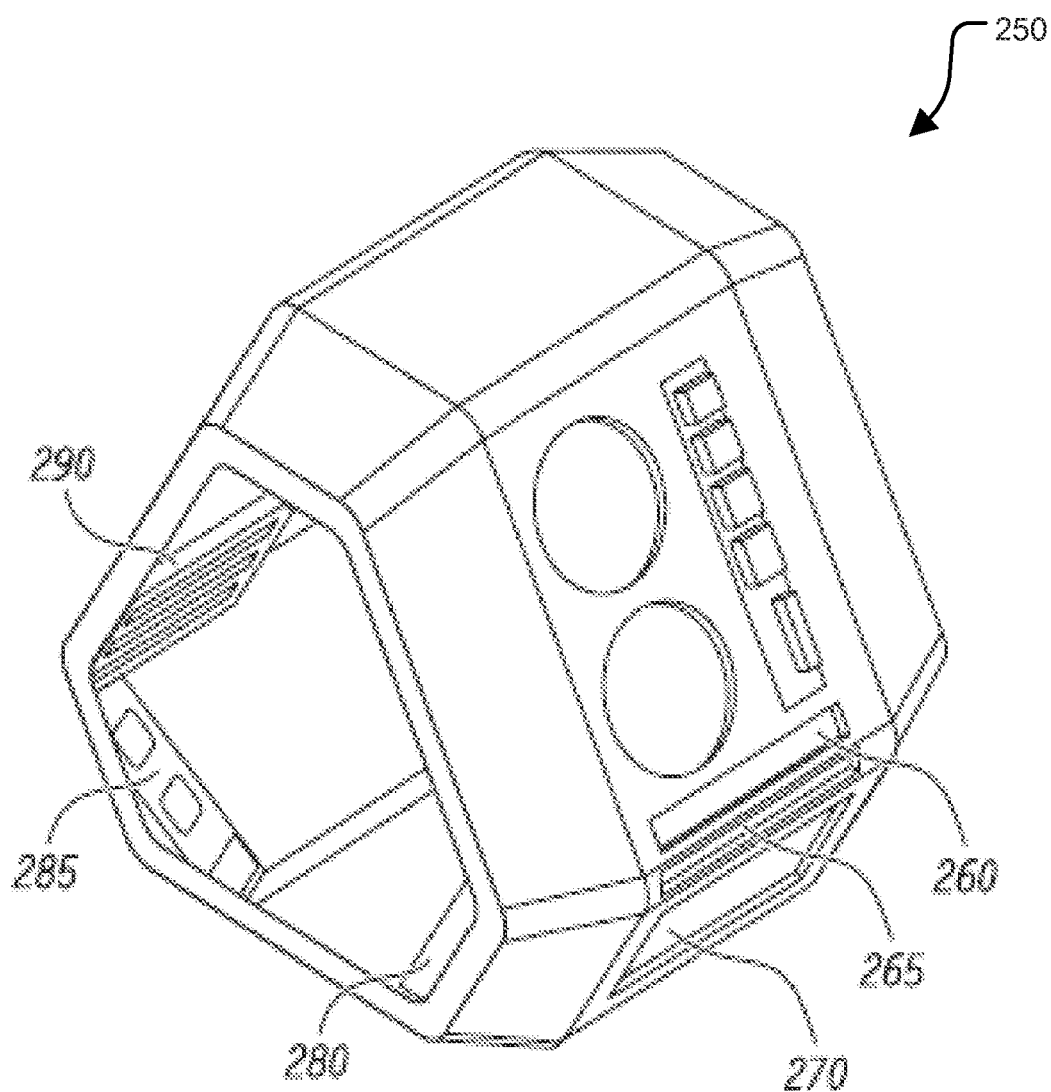

FIGS. 2A and 2B are block diagrams illustrating portions of an information handling system according to other embodiments of the present disclosure. Information handling system 200 of FIG. 2A includes chassis 105 with components CPU 112, fans 110, 115, 120, and 155, power supply unit (PSU) 135, and graphics cards 140, 145, and 150. Information handling system 200 also includes support 202, inlets 248 and 249, and fan offset 252. Inlets 248 and 249 provide inlets for airflow to fan 120. The inlets may provide additional airflow, thereby enabling fan 120 to operate more efficiently. In addition, offset 252, between fan 120 and chassis 105, spaces fan 120 away from chassis 105, providing space 246 between fan 120 and chassis 105, and may enable additional airflow to develop. In other embodiments, inlets and offsets may provide airflow to other fans. In some embodiments, inlets may be provided without offsets, or offsets without inlets. In some embodiments, inlets may be omitted. Support 202 may protect fan 120 and enable a user to take hold of information handling system 200.

FIG. 2B shows chassis 250 of an information handling system, such as information handling system 200 of FIG. 2A. Chassis 250 is triangular-shaped and includes inlets 260, 265, and 270 at one vertex to provide airflow to a fan to be attached to the chassis near the vertex. In some embodiments, the shape of the chassis and arrange of the inlets may provide 3D venting to the fan. Support 285 may hold a PSU. Supports 280 and 290 may hold graphics cards. When the graphics cards are inserted in the supports, airflow from the fan axially aligned with the graphics cards, enabling efficient cooling of the graphics cards. In other embodiments, inlets may be omitted. In many embodiments, the location of supports relative to inlets may be different.

Figure 3:
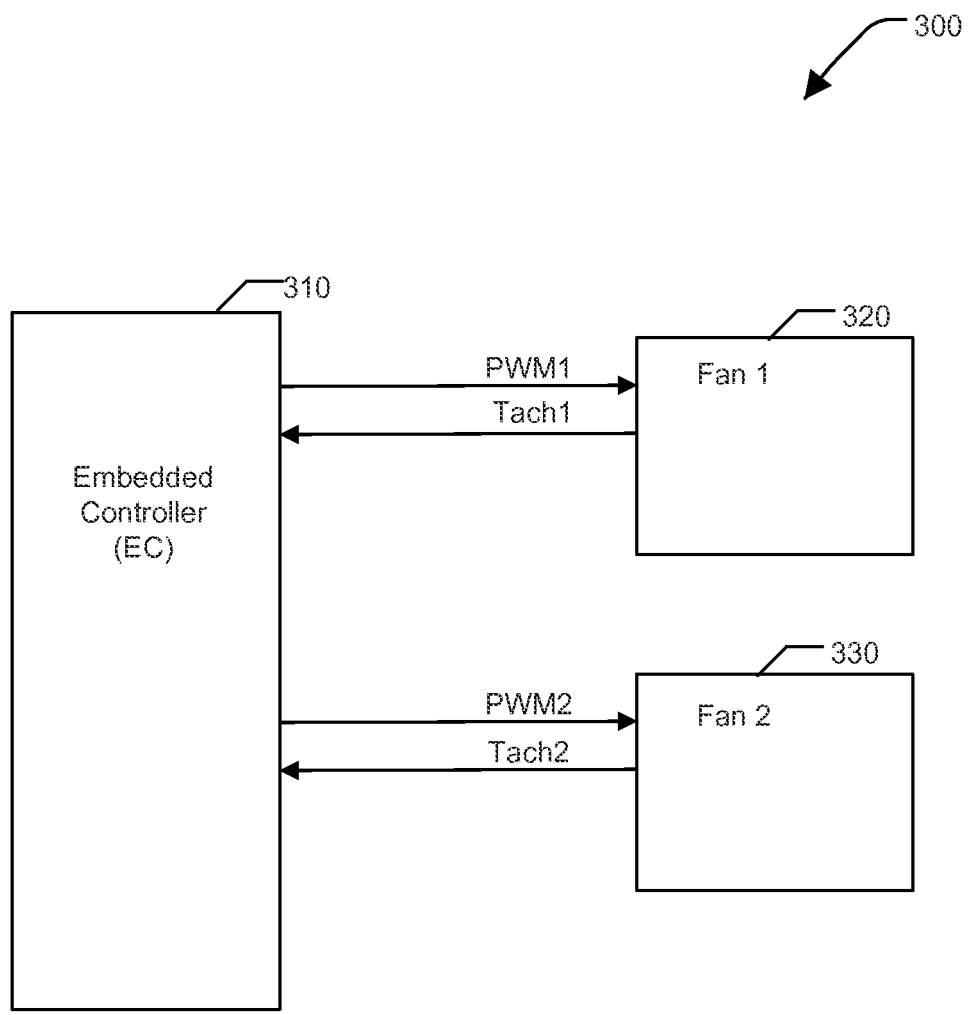
FIG. 3 is a block diagram illustrating the control of a fan of an information handling system according to an embodiment of the present disclosure.

FIG. 3 is a block diagram 300 illustrating the control of fans of an information handling system according to an embodiment of the present disclosure. Diagram 300 includes fans 320 and 330 and embedded controller (EC) 310. EC 310 can include a microcomputer or another type of processor. EC 310 may be referred to as a system management controller (SMC), a baseband management controller (BMC), or the like. In further embodiments, EC 310 may be a super IO (SIO) chip or a platform controller hub (PCH). EC 310 may be responsible for performing various background tasks at the system 300.

One such task is the control of system cooling devices. For example, EC 310 can initiate operation of fans 320 and 330 prior to activating a central processing unit, or can regulate the speed of fans 320 and 330 in response to an ambient temperature or other parameter of fan operation. As the temperature increases, the speed of a fan may be increased. Temperature sensors within the information handling system may be coupled to EC 310 to provide information used to control the speed of fan 320 and 330. In many embodiments, EC310 may control the fans independently. Thus, if the temperature is normal in a region cooled by one fan and high in a region cooled by another fan, EC310 could maintain the speed of the first fan and increase the speed of the second fan. As a result, an information handling system could save on power consumption when compared with increasing the speed of both fans.

The operating speed of fans 320 and 330 can be controlled using pulse-width-modulation (PWM). For example, a duty cycle of a supply voltage provided to fans 320 and 330, labeled PWM1 and PWM2, can determine the speed of fans 320 and 330, respectively. Fans 320 and 330 include outputs for providing signals, Tach1 and Tach2, that indicate the present speeds of fans 320 and 330 respectively, to EC 310. In some embodiments, EC 310 may use the tachometer readings in a feedback loop. EC 310 may adjust the PWM signals based upon the tachometer readings to ensure that the fans are operating as desired.

In other embodiments, a fan controller may be coupled to a baseboard management controller or a service processor. In several embodiments, the cooling in an information handling system may be provided by blowers or other air movers. In some embodiments, a fan controller may be a separate component, coupled to a processor, that is not part of an embedded controller or other system management controller. In many embodiments, a fan controller may control more than two fans. In further embodiments, it may independently control more than two fans.

Figure 4:
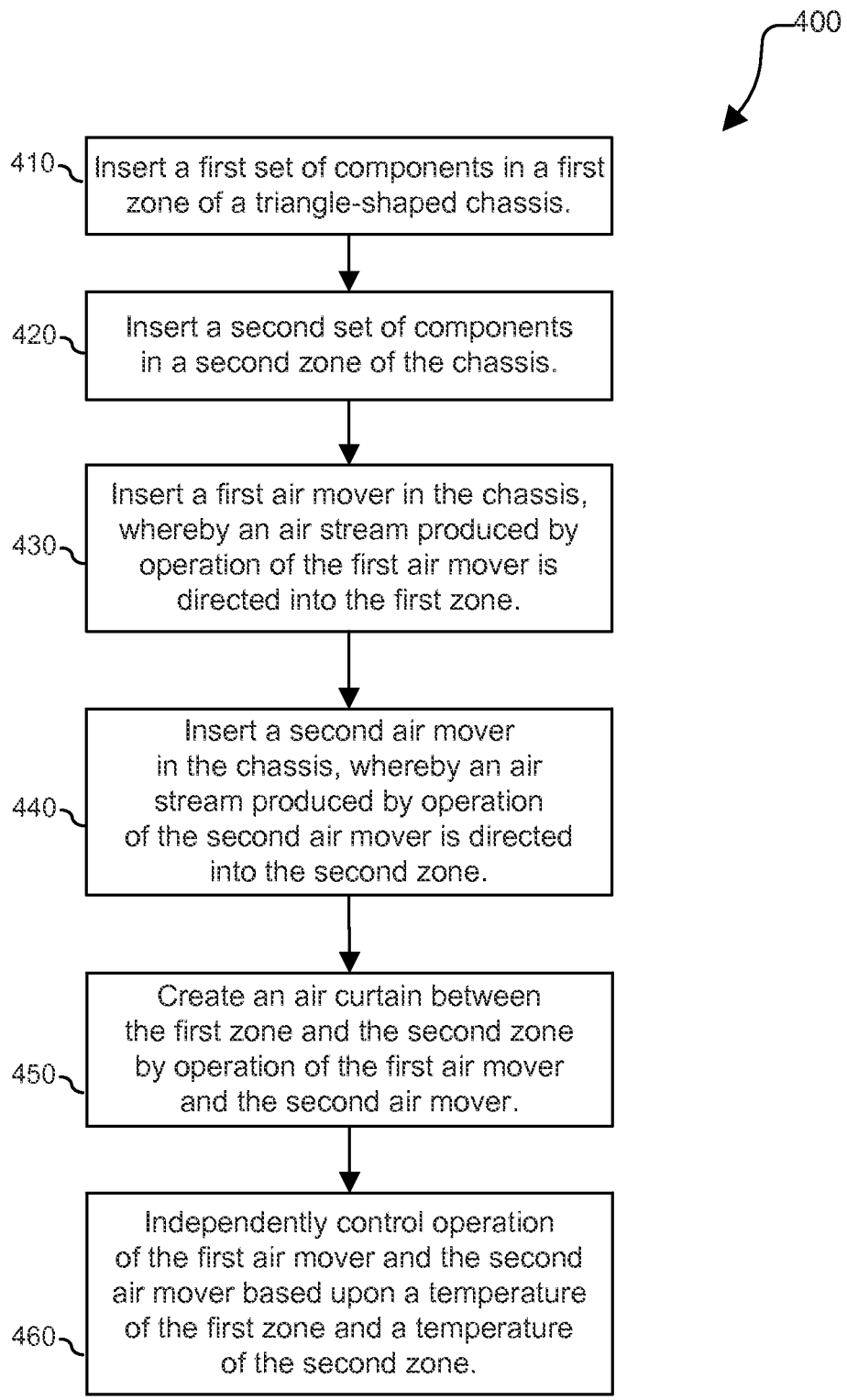
FIG. 4 is a flow diagram illustrating a method of thermal control of an information handling system according to an embodiment of the present disclosure.

FIG. 4 shows a flow diagram of a method 400 of thermal control of an information handling system according to an embodiment of the present disclosure. At block 410, a first set of components is inserted in a first zone of a triangle-shaped chassis of the information handling system. At block 420, a second set of components is inserted in a second zone of the chassis. In one embodiment, a CPU is in one zone, and graphics cards and a power supply unit (PSL)) are in another zone. At block 430, a first air mover is inserted in the chassis. At block 440, a second air mover is inserted in the chassis. The air movers may comprise fans. When the information handling system is operational, an air stream produced by operation of the first air mover is directed into the first zone and an air stream produced by operation of the second air mover is directed into the second zone. At block 450, an air curtain between the first zone and the second zone is created by operation of the first air mover and the second air mover. The air curtain may enable thermal control of the zones separately. At block 460, the operation of the first air mover and the second air mover is independently controlled based upon a temperature of the first zone and a temperature of the second zone. As a result, the temperatures of the two zones may be set to different values. Alternatively, power to one air mover may be reduced when not necessary to maintain a desired temperature in the zone cooled by the air mover.

Other embodiments may include more than two zones or more than two air movers. In many embodiments, additional cooling mechanisms, such as liquid cooling radiators and passive cooling structures, may be utilized. In other embodiments, control of the air movers may be based upon other operating parameters of components of an information handling system, such as a load upon components. The load may, for example, be a load of the graphics cards or a load of the CPU. In further embodiments, the load of a component may be measured by power consumption of the component.

Figure 5:
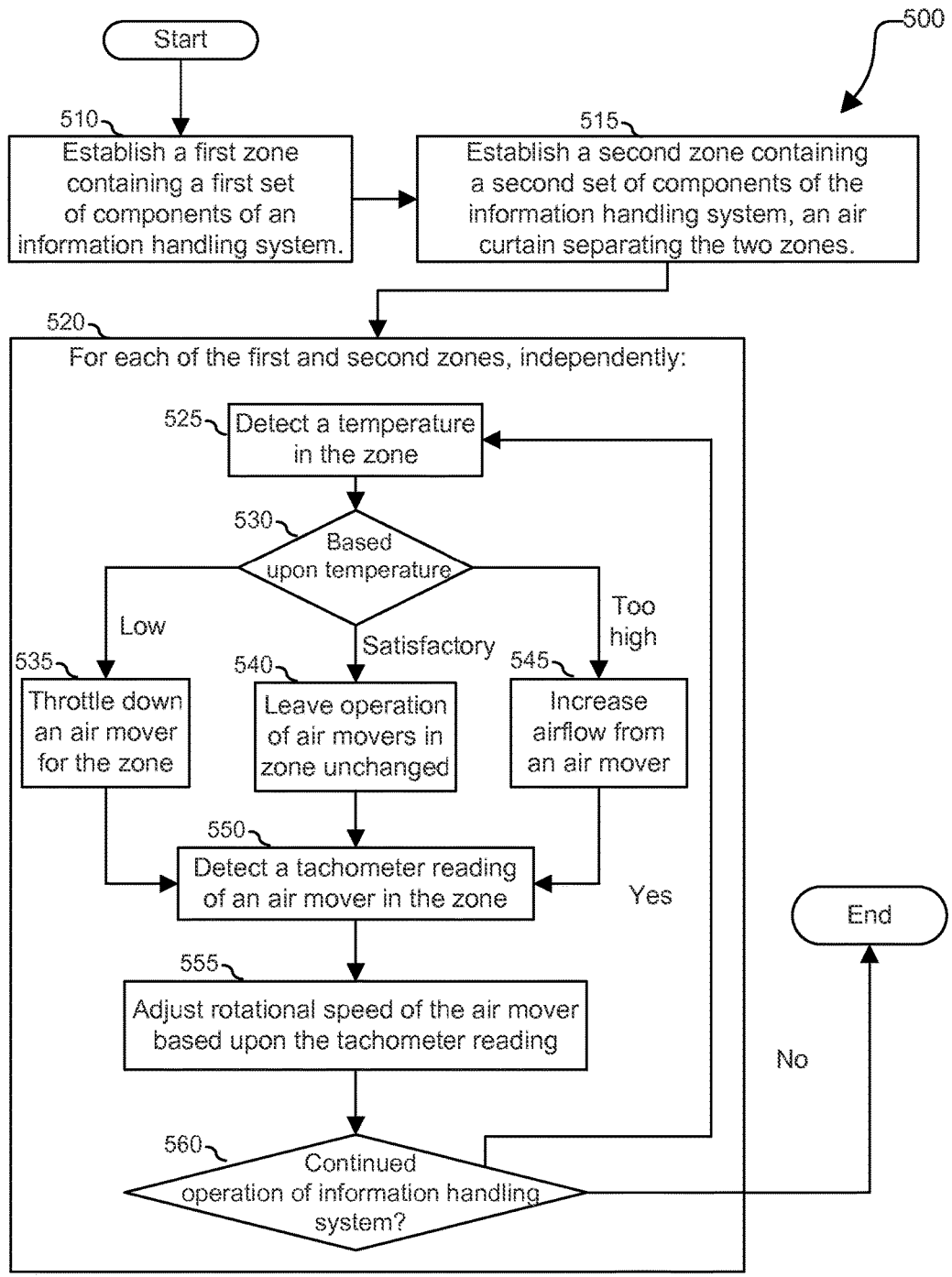
FIG. 5 is a flow diagram illustrating another method of thermal control of an information handling system according to an embodiment of the present disclosure.

FIG. 5 shows a flow diagram of a method 500 of thermal control of an information handling system according to an embodiment of the present disclosure. At block 510, a first zone in an information handling system containing a first set of components is established. At block 515, a second zone in an information handling system containing a second set of components is established. Temperatures in the zones can be controlled independently. In many embodiments, an air curtain may separate the zones. As a result, a temperature differential between the zones may be more easily maintained. Thus, the zones may be established based upon the operation of air movers of the information handling system. The air movers may comprise fans. In some embodiments, a CPU may be in one zone and graphics cards in the other zone. As a result, the temperatures of those two components may be controlled independently. When the graphics cards are near their temperature limit, the air flow produced by an air mover or air movers directing air flow to the graphics cards may be increased without the need to increase the air flow on the CPU, thus saving power.

A block 520, a set of operations to control the temperature of the zones is performed for each of the zones independently. The operations may be performed by an air mover controller such as embedded controller 310 of FIG. 3. At block 525, a temperature in the zone is detected. Temperature sensors within the information handling system may be coupled to an air mover controller to provide information used to control the speed of air movers used to control the temperature of the zone. At block 530, an operation to control the temperature of the zone is performed based upon the temperature. If the temperature is low, so that the current degree of cooling may be unnecessary, at block 535 an air mover for the zone may be throttled down; that is, the speed or power of the air mover may be reduced. The reduction may be implemented by reducing power to the air mover or, in the case of PWM signals, by reducing the frequency of the signals. In some cases, the air mover may be temporarily turned off. If the temperature is too high, at block 545, airflow from an air mover in the zone may be increased. The increase may be implemented by increasing the rotation of the blades of the air mover, such as by increasing power to the air mover. The temperature may be too high if it nears an operational limit of a component of the zone. Otherwise, at block 540, if the temperature is satisfactory, the operation of the air movers in the zone is left unchanged.

At block 550, a tachometer reading of an air mover in the zone is detected. In some embodiments, a sensor contained in the air mover may signal a controller with a tachometer reading. At block 555, a rotational speed of the air mover is adjusted based upon the reading. The air mover may be throttled down if the speed is higher than desired for the temperature reading, may be throttled up if the speed is lower than desired for the temperature reading, or may be left alone if the speed is satisfactory. Thus, the tachometer reading may provide a feedback mechanism for controlling air movers. In other embodiments, other control mechanisms may be used. In some embodiments, air movers may be controlled without the use of tachometer readings. A controller may, for example, continue to increase power within operational limits until a desired cooling is achieved. At block 560, if the information handling system continues to operate, the actions of block 520 are repeated for each zone. Otherwise, method 500 may end.

In other embodiments, the air movers of the two zones may be controlled based upon other or additional readings. The operation of air movers may, for example, be modified based upon a measurement of a load upon components of the information handling system, such as the CPU or graphics cards. The air flow produced by the air movers may be increased when the load on the component increases to forestall a build-up of temperature. In other embodiments, three or more zones may be controlled independently.

Figure 6:
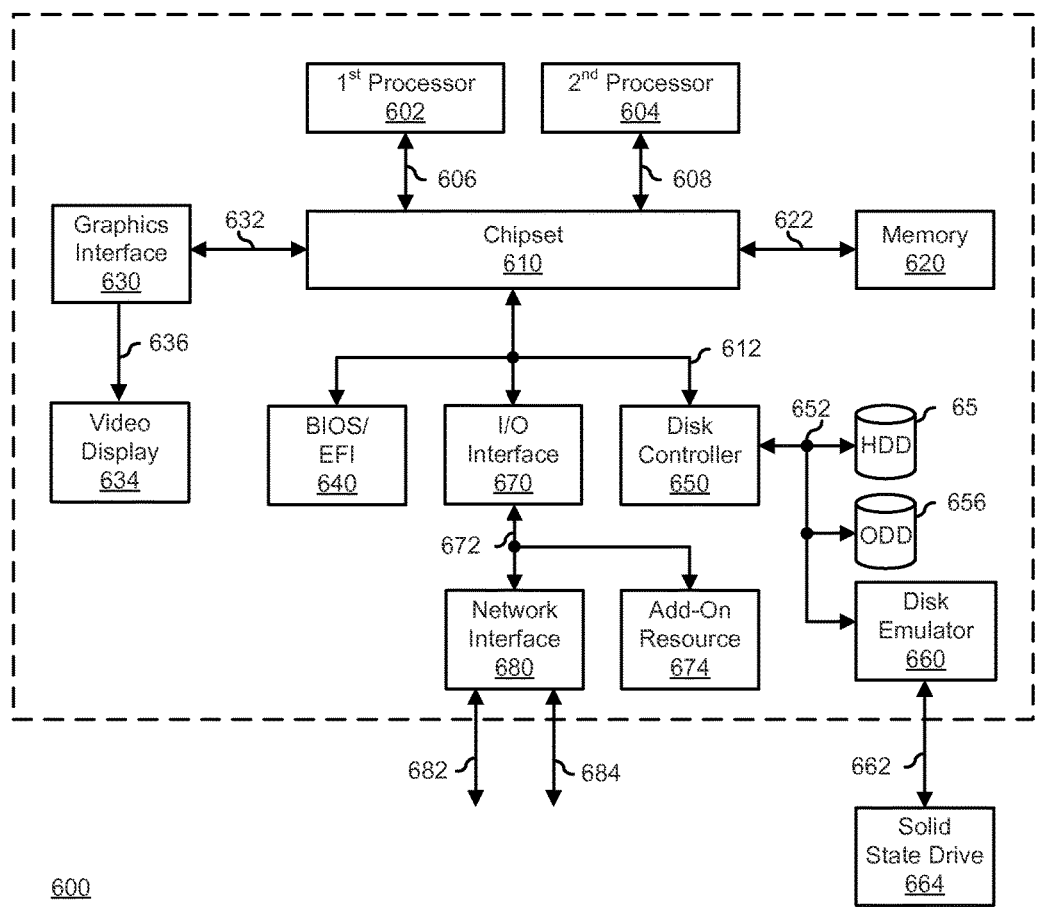
FIG. 6 is a block diagram illustrating an information handling system according to another embodiment of the present disclosure.

FIG. 6 illustrates a generalized embodiment of information handling system 600. Information handling system 600 can include devices or modules that embody one or more of the devices or modules described above, and operates to perform one or more of the methods described above. Information handling system 600 includes a processors 602 and 604, a chipset 610, a memory 620, a graphics interface 630, include a basic input and output system/extensible firmware interface (BIOS/EFI) module 640, a disk controller 650, a disk emulator 660, an input/output (I/O) interface 670, and a network interface 680. Processor 602 is connected to chipset 610 via processor interface 606, and processor 604 is connected to chipset 610 via processor interface 608. Memory 620 is connected to chipset 610 via a memory bus 622. Graphics interface 630 is connected to chipset 610 via a graphics interface 632, and provides a video display output 636 to a video display 634. In a particular embodiment, information handling system 600 includes separate memories that are dedicated to each of processors 602 and 604 via separate memory interfaces. An example of memory 620 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 640, disk controller 650, and I/O interface 670 are connected to chipset 610 via an I/O channel 612. An example of I/O channel 612 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 610 can also include one or more other I/O interfaces, including an Industry Standard Architecture OSA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/EFI module 640 includes BIOS/EFI code operable to detect resources within information handling system 600, to provide drivers for the resources, initialize the resources, and access the resources. BIOS/EFI module 640 includes code that operates to detect resources within information handling system 600, to provide drivers for the resources, to initialize the resources, and to access the resources.

Disk controller 650 includes a disk interface 652 that connects the disc controller to a hard disk drive (HDD) 654, to an optical disk drive (ODD) 656, and to disk emulator 660. An example of disk interface 652 includes an integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 660 permits a solid-state drive 664 to be connected to information handling system 600 via an external interface 662. An example of external interface 662 includes a USB interface, an IEEE 6194 (Firewire) interface, a proprietary interface, or a combination thereof. Alternatively, solid-state drive 664 can be disposed within information handling system 600.

I/O interface 670 includes a peripheral interface 672 that connects the I/O interface to an add-on resource 674 and to network interface 680. Peripheral interface 672 can be the same type of interface as I/O channel 612, or can be a different type of interface. As such, I/O interface 670 extends the capacity of channel 612 when peripheral interface 672 and the I/O channel are of the same type, and the I/O interface translates information from a format suitable to the I/O channel to a format suitable to the peripheral channel 672 when they are of a different type. Add-on resource 674 can include a data storage system, an additional graphics interface, a network interface card (NIC), a sound/video processing card, another add-on resource, or a combination thereof. Add-on resource 674 can be on a main circuit board, on separate circuit board or add-in card disposed within information handling system 600, a device that is external to the information handling system, or a combination thereof.

Network interface 680 represents a NIC disposed within information handling system 600, on a main circuit board of the information handling system, integrated onto another component such as chipset 610, in another suitable location, or a combination thereof, Network interface device 680 includes network channels 682 and 684 that provide interfaces to devices that are external to information handling system 600. In a particular embodiment, network channels 682 and 684 are of a different type than peripheral channel 672 and network interface 680 translates information from a format suitable to the peripheral channel to a format suitable to external devices. An example of network channels 682 and 684 includes InfiniBand channels, Fibre Channel channels, Gigabit Ethernet channels, proprietary channel architectures, or a combination thereof. Network channels 682 and 684 can be connected to external network resources (not illustrated). The network resource can include another information handling system, a data storage system, another network, a grid management system, another suitable resource, or a combination thereof.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, a consumer electronic device, a network server or storage device, a switch router, wireless router, or other network communication device, a network connected device (cellular telephone, tablet device, etc.), or any other suitable device, and can vary in size, shape, performance, price, and functionality.

The information handling system can include memory (volatile (e.g. random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system can include one or more storage devices, one or more communications ports for communicating with external devices, as well as, various input and output (I/O) devices, such as a keyboard, a mouse, a video/graphic display, or any combination thereof. The information handling system can also include one or more buses operable to transmit communications between the various hardware components. Portions of an information handling system may themselves be considered information handling systems.

When referred to as a "device," a "module," or the like, the embodiments described herein can be configured as hardware. For example, a portion of an information handling system device may be hardware such as, for example, an integrated circuit (such as an Application Specific integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card international Association (PCMCIA) card, or other such expansion card), or a system (such as a motherboard, a system-on-a-chip (SoC), or a stand-alone device).

The device or module can include software, including firmware embedded at a device, such as a Pentium class or PowerPC™ brand processor, or other such device, or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system comprising:
a triangular chassis supporting a first set of components and a second set of components, wherein the first set of components is in a first zone in an internal cavity of the triangular chassis and the second set of components is in a second zone in the internal cavity with at least a portion of the second zone is between a first vertex and a side opposite of the first vertex of the triangular chassis;
the first set of components coupled in the first zone of the triangular chassis, the first set including a CPU;
the second set of components coupled in the second zone of the triangular chassis, the second set including a power supply unit (PSU);
a plurality of air movers including a first air mover and a second air mover; and
an air mover controller, wherein the first air mover is to direct an air stream into the first zone within the triangular chassis, the second air mover is mounted at a first vertex of the triangular chassis to direct an air stream into the second zone of the internal cavity between the first vertex and the side opposite of the first vertex of the triangular chassis, the air movers to generate an airflow in the second zone to produce an air curtain that separates the first zone and the second zone, and the air mover controller is to control the first air mover independently of the second air mover, thereby enabling independent control of a first temperature in the first zone and a second temperature in the second zone.

2. The information handling system of claim 1, wherein the air movers comprise fans creating a laminar air flow in the first or second zone in the internal cavity.

3. The information handling system of claim 2, wherein the second set of components comprises a plurality of graphics cards.

4. The information handling system of claim 1, wherein:
the triangular chassis further includes chamfered vertices;
a processor, including the CPU or GPU, is proximate to one of the vertices of the chassis; and
the information handling system comprises a liquid cooling radiator to cool the processor.

5. The information handling system of claim 4, wherein the second zone includes a third venting air mover opposite the second air mover creating a laminar air flow in the second zone.

6. The information handling system of claim 1, wherein the air mover controller is coupled to a baseboard management controller.

7. A method comprising:
operating a first air mover to provide air flow in a first zone of an internal cavity of an information handling system having a triangular chassis, the first zone containing a first set of components comprising a CPU;
operating a second air mover, mounted at a first vertex of the triangular chassis, to provide air flow in a second zone of the internal cavity of the information handling system containing a second set of components comprising a power supply unit (PSU), with at least a portion of the second zone between a first vertex and a first side opposite of the first vertex of the triangular chassis, wherein operating the first air mover and the second air mover produces an airflow to generate an air curtain separating the first zone and the second zone;
monitoring the first set of components and the second set of components; and
independently controlling the first air mover and the second air mover with an air mover controller, thereby enabling independent control of a first temperature of the air flow in the first zone and a second temperature of the air flow in the second zone.

8. The method of claim 7, wherein the monitoring is monitoring a load of a component of the first set of components and a load of a component of the second set of components.

9. The method of claim 7, wherein the monitoring is monitoring a temperature of a component of the first set of components and a temperature of a component of the second set of components.

10. The method of claim 7, wherein the second set of components comprises a plurality of graphics cards.

11. The method of claim 7, wherein the second zone includes a third venting air mover mounted at the first vertex opposite the second air mover creating a laminar air flow in the second zone.

12. The method of claim 7, wherein the air mover controller is to send pulse width modulation (PWM) signals to the first air mover and the second air mover.

13. The method of claim 7, wherein the air mover controller comprises a super TO (SIO) chip or a platform controller hub (PCH) chip.

14. An information handling system comprising:
a triangular chassis with chamfered vertices;
a plurality of graphics cards, a CPU and a power supply unit (PSU) in an internal cavity of the triangular chassis;
a first zone of the internal cavity containing the plurality of graphics cards and the power supply unit with at least a portion of the first zone between a first chamfered vertex and a first side opposite of the first chamfered vertex of the triangular chassis;
a second zone of the internal cavity containing the CPU;
a plurality of air movers, wherein an air stream of a first air mover is axially aligned with the graphics cards and the first air mover is mounted to draw air into the first zone of the internal cavity and vent air from the first zone of the internal cavity, wherein the first air mover is mounted at the first chamfered vertex of the triangular chassis to direct the air stream into the first zone of the internal cavity, the air stream being parallel to a longitudinal axis of the graphics cards between the first side and the first chamfered vertex of the triangular chassis; and
the first zone of the internal cavity creating a thermal barrier from the second zone of the internal cavity by an air curtain generated by the air stream directed into the first cavity;
and an air mover controller is to control the first air mover independently of a second air mover, thereby enabling independent control of a first temperature in the first zone and a second temperature in the second zone.

15. The information handling system of claim 14, wherein:
the first chamfered vertex comprises the outlet vent; and
the first side of the triangular chassis opposite the first chamfered vertex has inlets to the first air mover.

16. The information handling system of claim 14, further comprising an offset between the graphics cards to create a space between the graphics cards for laminar airflow of the airstream in the first zone.

17. The information handling system of claim 14, wherein a second air mover is mounted at the vent at the first side or the first chamfered vertex of the triangular chassis opposite to the first air mover to vent the air stream from the first zone.

18. The information handling system of claim 14, wherein:
a second air mover to generate an airflow for information handling system components mounted in the second zone of the internal cavity of the triangular chassis.

19. The information handling system of claim 18, wherein the air mover controller comprises a super IO (SIO) chip or a platform controller hub (PCH) chip.

20. The information handling system of claim 14, wherein:
the first air mover is mounted proximate to the first side of the triangular chassis opposite to the first chamfered vertex;
the first side of the triangular chassis comprises inlets to the first air mover; and
the first chamfered vertex opposite the first side of the triangular chassis has the outlet vent.

* * * * *